(12) United States Patent
Laaksonen et al.

(10) Patent No.: US 12,583,043 B2
(45) Date of Patent: Mar. 24, 2026

(54) PROCESS CHAMBER WITH UV IRRADIANCE

(71) Applicant: Yield Engineering Systems, Inc., Fremont, CA (US)

(72) Inventors: Tapani Laaksonen, Fremont, CA (US); M Ziaul Karim, San Jose, CA (US); Christopher Lane, Los Gatos, CA (US); Craig Walter McCoy, Los Gatos, CA (US); Ramakanth Alapati, Dublin, CA (US)

(73) Assignee: Yield Engineering Systems, Inc., Fremont, CA (US)

( * ) Notice: Subject to any disclaimer, the term of this patent is extended or adjusted under 35 U.S.C. 154(b) by 191 days.

(21) Appl. No.: 18/311,513

(22) Filed: May 3, 2023

(65) Prior Publication Data

US 2023/0294190 A1 Sep. 21, 2023

Related U.S. Application Data

(63) Continuation-in-part of application No. 17/872,320, filed on Jul. 25, 2022, now Pat. No. 11,850,672,
(Continued)

(51) Int. Cl.
B23K 1/015 (2006.01)
B23K 1/00 (2006.01)
(Continued)

(52) U.S. Cl.
CPC .............. B23K 1/015 (2013.01); B23K 1/008 (2013.01); B23K 3/085 (2013.01); H01L 24/742 (2013.01);
(Continued)

(58) Field of Classification Search
CPC ................................ B23K 1/015; B23K 3/085
See application file for complete search history.

(56) References Cited

U.S. PATENT DOCUMENTS

| | | | |
|---|---|---|---|
| 4,924,599 A | 5/1990 | Bubley |
| 5,046,658 A | 9/1991 | Morris |

(Continued)

FOREIGN PATENT DOCUMENTS

| | | |
|---|---|---|
| CN | 102528194 A | 7/2012 |
| CN | 103357981 A | 10/2013 |

(Continued)

OTHER PUBLICATIONS

Machine translation CN103357981A (Year: 2013).*

(Continued)

*Primary Examiner* — Abbas Rashid
*Assistant Examiner* — Wayne K. Swier
(74) *Attorney, Agent, or Firm* — Fish & Richardson P.C.

(57) ABSTRACT

A semiconductor processing apparatus includes a process chamber that defines an enclosure. The enclosure includes a substrate support configured to support a substrate and rotate the substrate about a central axis of the process chamber. The substrate support is also configured to move vertically along the central axis and position the substrate at multiple locations in the enclosure. The apparatus also includes one or more UV lamps configured to irradiate a top surface of the substrate supported on the substrate support.

23 Claims, 16 Drawing Sheets

Related U.S. Application Data which is a continuation of application No. 17/692,760, filed on Mar. 11, 2022, now Pat. No. 11,465,225, which is a continuation-in-part of application No. 17/463,012, filed on Aug. 31, 2021, now Pat. No. 11,296,049.

(51) Int. Cl.

| | |
|---|---|
| *B23K 1/008* | (2006.01) |
| *B23K 1/012* | (2006.01) |
| *B23K 3/08* | (2006.01) |
| *B23K 101/40* | (2006.01) |
| *B23K 101/42* | (2006.01) |
| *H01L 21/60* | (2006.01) |
| *H01L 23/00* | (2006.01) |

(52) U.S. Cl.
CPC ............ *H01L 24/75* (2013.01); *B23K 1/0016* (2013.01); *B23K 1/012* (2013.01); *B23K 2101/40* (2018.08); *B23K 2101/42* (2018.08); *H01L 2021/60007* (2013.01); *H01L 2021/60135* (2013.01); *H01L 2021/6027* (2013.01); *H01L 2224/75272* (2013.01); *H01L 2224/75283* (2013.01)

(56) References Cited

U.S. PATENT DOCUMENTS

| | | | |
|---|---|---|---|
| 6,544,338 | B1 | 4/2003 | Batchelder et al. |
| 7,501,292 | B2 | 3/2009 | Matsushita et al. |
| 7,511,281 | B2 | 3/2009 | Cooper |
| 7,589,336 | B2 | 9/2009 | Kazsuba et al. |
| 7,731,798 | B2 * | 6/2010 | Shareef ............... B23K 26/703 |
| | | | 219/448.11 |
| 7,777,198 | B2 * | 8/2010 | Rocha-Alvarez ...... B05D 3/067 |
| | | | 250/493.1 |
| 7,829,899 | B2 | 11/2010 | Hutchins |
| 8,252,678 | B2 | 8/2012 | Zhang |
| 8,900,399 | B2 | 12/2014 | Ravi |
| 8,951,348 | B1 | 2/2015 | Shrinivasan et al. |
| 9,243,845 | B2 | 1/2016 | Sugihara et al. |
| 9,530,819 | B2 * | 12/2016 | Maekawa ............. H10F 39/811 |
| 9,682,438 | B2 | 6/2017 | Oyama |
| 9,773,744 | B2 | 9/2017 | Willeke |
| 10,147,617 | B2 | 12/2018 | Moffat |
| 10,537,031 | B2 | 1/2020 | Hillman et al. |
| 10,583,510 | B2 | 3/2020 | Yokoyama et al. |
| 10,875,114 | B2 | 12/2020 | Nagai |
| 11,296,049 | B1 | 4/2022 | Lane et al. |
| 11,335,662 | B2 | 5/2022 | Karim et al. |
| 11,456,274 | B1 | 9/2022 | Karim et al. |
| 11,465,225 | B1 | 10/2022 | Jing et al. |
| 11,850,672 | B2 | 12/2023 | Jing et al. |
| 12,330,228 | B2 | 6/2025 | Jing et al. |
| 2005/0115498 | A1 | 6/2005 | Ingram et al. |
| 2005/0263719 | A1 | 12/2005 | Ohdaira et al. |
| 2006/0249175 | A1 | 11/2006 | Nowak et al. |
| 2007/0120227 | A1 | 5/2007 | Suzuki et al. |
| 2007/0289604 | A1 | 12/2007 | Fukunaga et al. |
| 2010/0260945 | A1 | 10/2010 | Kites et al. |
| 2010/0285240 | A1 | 11/2010 | Rocha-Alvarez et al. |
| 2013/0175323 | A1 | 7/2013 | Zhang |
| 2015/0122876 | A1 * | 5/2015 | Breingan ............... B23K 1/203 |
| | | | 228/19 |
| 2021/0265301 | A1 | 8/2021 | Karim |
| 2023/0060603 | A1 | 3/2023 | Jing et al. |
| 2023/0294190 | A1 | 9/2023 | Laaksonen et al. |
| 2024/0066618 | A1 | 2/2024 | Jing et al. |
| 2025/0276394 | A1 | 9/2025 | Jing et al. |

FOREIGN PATENT DOCUMENTS

| | | | | |
|---|---|---|---|---|
| CN | 104625296 | A | 5/2015 | |
| CN | 106077863 | A * | 11/2016 | ........... C23C 14/022 |
| CN | 107112247 | A | 8/2017 | |
| CN | 113146015 | A * | 7/2021 | ........... B23K 20/023 |
| JP | 2002-144076 | A | 5/2002 | |
| JP | 2002298790 | A | 10/2002 | |
| WO | WO 2007116364 | A2 | 10/2007 | |
| WO | WO 2012/166911 | A2 | 12/2012 | |
| WO | WO 2015116996 | A1 | 8/2015 | |

OTHER PUBLICATIONS

Machine translation CN106077863A (Year: 2016).*
Machine translation CN113146015A (Year: 2021).*
Extended European Search Report in European Application No. 22193015.9, mailed on Jan. 17, 2023, 7 pages.
International Preliminary Report on Patentability in International Application No. PCT/US2022/038713, mailed on Mar. 14, 2024, 5 pages.
International Search Report and Written Opinion in International Application No. PCT/US2022/038713, mailed on Aug. 29, 2022, 6 pages.
Search Report in Taiwanese Patent Application No. 111127807, Jul. 11, 2023, 2 pages (Partial Translation).

* cited by examiner

200

PROCESS CHAMBER WITH UV IRRADIANCE

CROSS-REFERENCE TO RELATED APPLICATIONS

The present application is a continuation-in-part of U.S. patent application Ser. No. 17/872,320, filed Jul. 25, 2022, which is a continuation of U.S. patent application Ser. No. 17/692,760 (now U.S. Pat. No. 11,465,225), filed Mar. 11, 2022, which is a continuation-in-part of U.S. patent application Ser. No. 17/463,012 (now U.S. Pat. No. 11,296,049), filed Aug. 31, 2021, each of which is incorporated herein by reference in its entirety.

TECHNICAL FIELD

The present disclosure relates to apparatuses and methods for applying UV radiation in a semiconductor wafer process chamber.

BACKGROUND

The electronics industry has continued to engineer greater functionality into smaller electronic devices at lower cost and higher performance. The quest to achieve better performance (higher speed and integration) has placed pressure on manufacturers and has forced integrated circuits (ICs) closer together. High-speed computer systems require that the central processing unit and the memory and controllers be proximal to minimize interconnection delays. The increased functionality of these chips has increased the number of inputs and outputs (I/Os). This, in turn, has imposed routing demands that have changed the way we think about fabricating printed wiring boards (PWBs) and building IC packages. The higher speeds and higher densities also create thermal and thermal stress problems that challenge the limits. As technology advances, line and spacing are getting smaller to maintain Moore's Law for silicon compatible devices such as displays, optics, as well as IC devices. As the interconnect line gets thinner and their spacing gets smaller, photoresist lines used to fabricate such interconnects gets thinner and taller. Such thin and tall photoresist lines may collapse without proper and controlled photoresist curing. The apparatus and methods of the current disclosure may alleviate some of the above-described issues. For example, the current disclosure address this issue by integrating a compact ultraviolet (UV) energy source that provides variable irradiation with a single wafer process chamber that provides controlled gas flow, temperature, pressure, and exhaust dynamics.

SUMMARY

Several embodiments of a semiconductor process chamber with an integrated UV source and method of using the chamber are disclosed. It is to be understood that both the foregoing general description and the following detailed description are exemplary and explanatory only. As such, the scope of the disclosure is not limited solely to the disclosed embodiments. Instead, it is intended to cover such alternatives, modifications and equivalents within the spirit and scope of the disclosed embodiments. Persons skilled in the art would understand how various changes, substitutions and alterations can be made to the disclosed embodiments without departing from the spirit and scope of the disclosure.

In one embodiments, a semiconductor processing apparatus is disclosed. The apparatus includes a process chamber defining an enclosure and a substrate support. The substrate support may be configured to (a) support a substrate, (b) rotate with the substrate about a central axis of the process chamber, and (c) move vertically along the central axis to position the substrate at multiple locations in the enclosure. The apparatus may also include one or more UV lamps configured to irradiate a top surface of the substrate supported on the substrate support and one or more motors configured to rotate the substrate support about the central axis and move the substrate support vertically along the central axis.

Various embodiments of the disclosed apparatus may alternatively or additionally include one or more of the following features: the one or more UV lamps may include a plurality of UV lamps symmetrically positioned about the central axis; the plurality of UV lamps may include four UV lamps; the process chamber may further include a transparent window that defines a top wall of the enclosure and the one or more UV lamps may be configured to irradiate the top surface of the substrate through the transparent window; the process chamber may further comprise a liquid-cooled cold plate that defines a bottom wall of the enclosure; the process chamber may further comprise a lid hinged to a base of the process chamber and the one or more UV lamps are disposed on an underside of the lid; the substrate support may further include one or more heaters configured to heat the substrate supported on the substrate support; a side wall of the process chamber may further comprise a substrate-inlet port configured to direct the substrate into the enclosure; a bottom wall of the process chamber may include a plurality of openings configured to direct an inert gas into the enclosure; a side wall of the process chamber may include a plurality of gas-inlet ports configured to direct an inert gas into the enclosure; the apparatus may further include a plurality of IR lamps configured to heat the top surface of the substrate supported on the support.

In some embodiments, a semiconductor processing apparatus is disclosed. The apparatus may include a process chamber defining an enclosure. A liquid-cooled cold plate may define a bottom wall of the enclosure and a transparent window may defines a top wall of the enclosure. The apparatus may include a substrate support positioned in the enclosure. The substrate support may be configured to (a) support a substrate thereon, (b) rotate along with the substrate about a central axis of the process chamber, and (c) move vertically along the central axis to position the substrate at multiple locations in the enclosure. The apparatus may also include one or more UV lamps configured to irradiate a top surface of the substrate supported on the substrate support through the transparent window.

Various embodiments of the disclosed apparatus may alternatively or additionally include one or more of the following features: the process chamber may further comprise a lid hinged to a base of the process chamber and the one or more UV lamps are disposed on an underside of the lid; the substrate support may include one or more heaters configured to heat the substrate supported on the substrate support; a side wall of the process chamber may further comprise a substrate-inlet port configured to direct the substrate into the enclosure; the one or more UV lamps may include a plurality of UV lamps symmetrically positioned about the central axis; the one or more UV lamps may include only a single UV lamp; the cold plate may include a plurality of openings configured to direct an inert gas into the enclosure; a side wall of the process chamber may include a plurality of gas-inlet ports configured to direct the inert gas into the enclosure; and the apparatus may further include a plurality of IR lamps configured to heat the top surface of the substrate supported on the substrate support.

BRIEF DESCRIPTION OF THE DRAWINGS

The accompanying drawings, which are incorporated in and constitute a part of this disclosure, illustrate exemplary embodiments and, together with the description, are used to explain the disclosed principles. In these drawings, where appropriate, reference numerals illustrating like structures, components, materials, and/or elements in different figures are labeled similarly. It is understood that various combinations of the structures, components, and/or elements, other than those specifically shown, are contemplated and are within the scope of the present disclosure.

For simplicity and clarity of illustration, the figures depict the general structure of the various described embodiments. Details of well-known components or features may be omitted to avoid obscuring other features, since these omitted features are well-known to those of ordinary skill in the art. Further, elements in the figures are not necessarily drawn to scale. The dimensions of some features may be exaggerated relative to other features to improve understanding of the exemplary embodiments. One skilled in the art would appreciate that the features in the figures are not necessarily drawn to scale and, unless indicated otherwise, should not be viewed as representing proportional relationships between different features in a figure. Additionally, even if it is not specifically mentioned, aspects described with reference to one embodiment or figure may also be applicable to, and may be used with, other embodiments or figures.

DETAILED DESCRIPTION

All relative terms such as "about," "substantially," "approximately," etc., indicate a possible variation of ±10% (unless noted otherwise or another variation is specified). For example, a feature disclosed as being about "t" units long (wide, thick, etc.) may vary in length from 4-0.10 to (t+0.1 t) units. Similarly, a temperature within a range of about 100-150° C. can be any temperature between (100-10%) and (150+10%). In some cases, the specification also provides context to some of the relative terms used. For example, a structure described as being substantially circular or substantially cylindrical may deviate slightly (e.g., 10% variation in diameter at different locations, etc.) from being perfectly circular or cylindrical. Further, a range described as varying from, or between, 5 to 10 (5-10), includes the endpoints (i.e., 5 and 10).

Unless otherwise defined, all terms of art, notations, and other scientific terms or terminology used herein have the same meaning as is commonly understood by one of ordinary skill in the art to which this disclosure belongs. Some of the components, structures, and/or processes described or referenced herein are well understood and commonly employed using conventional methodology by those skilled in the art. Therefore, these components, structures, and processes will not be described in detail. All patents, applications, published applications and other publications referred to herein as being incorporated by reference are incorporated by reference in their entirety. If a definition or description set forth in this disclosure is contrary to, or otherwise inconsistent with, a definition and/or description in these references, the definition and/or description set forth in this disclosure controls over those in the references that are incorporated by reference. None of the references described or referenced herein is admitted as prior art to the current disclosure.

Figure 1A:
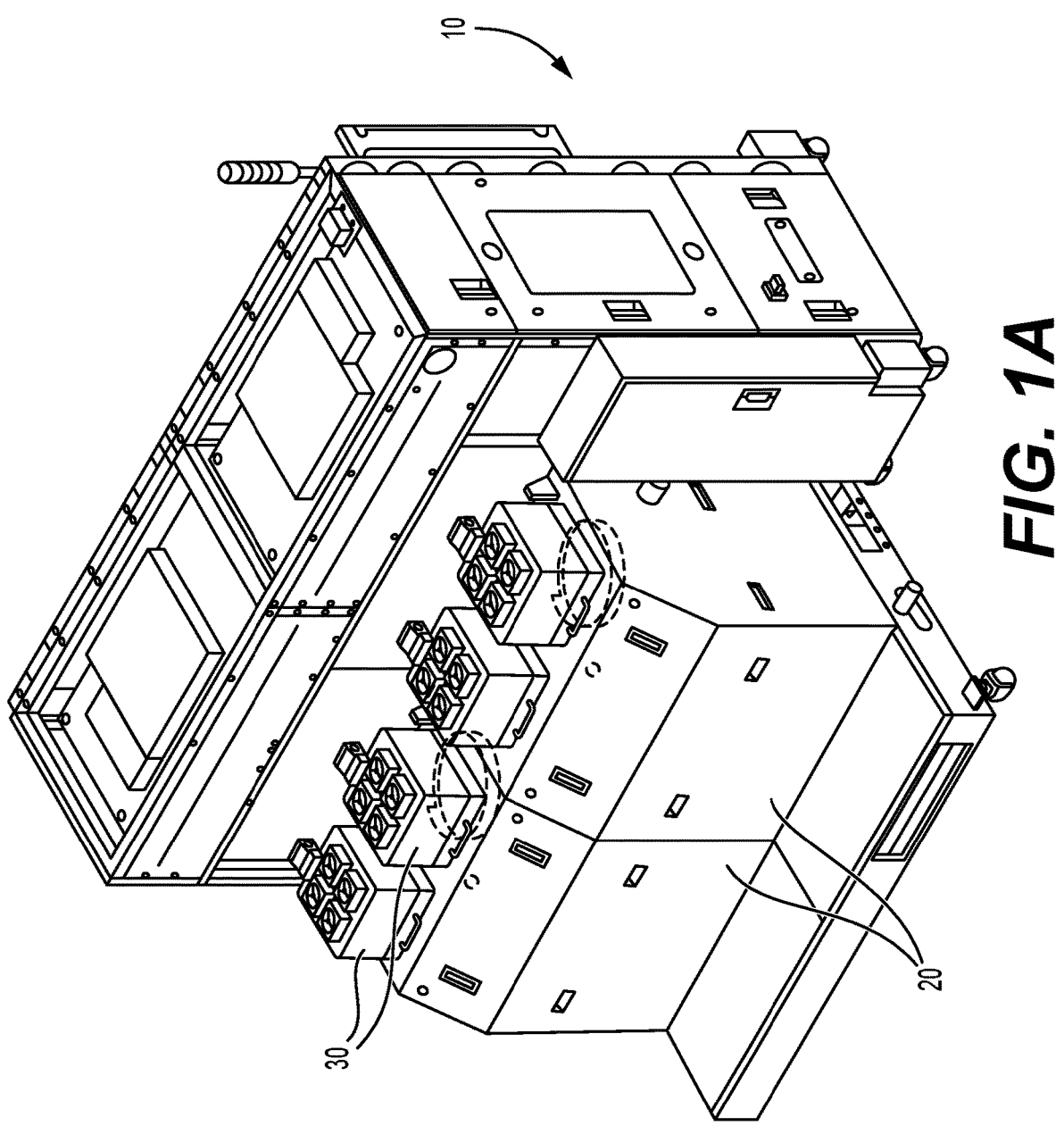
FIG. 1A is an exemplary semiconductor processing apparatus of the current disclosure.
Figure 1B:
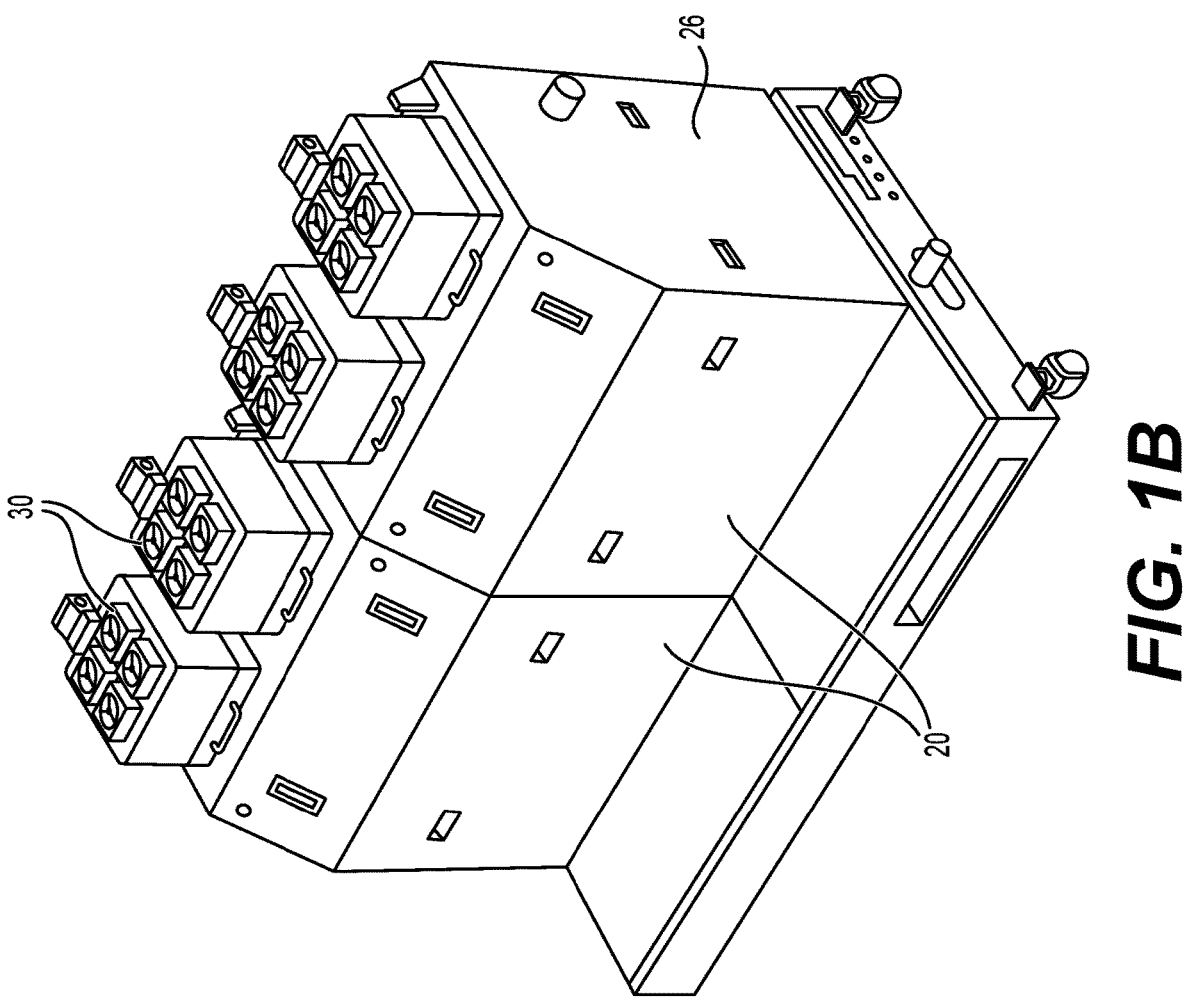
FIG. 1B illustrates an exemplary process module of the apparatus of FIG. 1A.

FIG. 1A is a perspective view of an exemplary semiconductor processing device (or apparatus) of the current disclosure. In general, processing device may be any type of apparatus having a process chamber (ovens, oxidation chambers, deposition chambers, etc.) that may be used in the processing of semiconductor devices. For the sake of brevity, in the discussion below, the processing device will be described as an oven 10. However, this is only exemplary and embodiments of the current disclosure may be applied to any processing device. In some embodiments, oven 10 may be a modular apparatus with different modules separately coupled together. These modules may include one or more process modules 20. Although FIG. 1A illustrates an oven 10 with two process modules 20, in general, oven 10 may include any number of process modules 20. FIG. 1B illustrates the process modules 20 of oven 10. Among other components, each process module 20 may include one or more process chambers (see FIGS. 2A and 2B) within housing 26. One or more UV modules 30 may be associated with each process module 20. FIGS. 1A and 1B illustrate two UV modules 30 coupled to each process module 20. However, this is only exemplary, and in general, each process module 20 may include any number (1, 3, 4, etc.) of UV modules 30. Each UV module 30 includes one or more UV light sources or UV lamps 32 (see, e.g., FIG. 5A) and components (e.g., power supply, fan, etc.) configured to activate and operate the UV lamps 32. The UV lamps 32 configured to emit UV (ultraviolet) radiation or UV light. As would be recognized by a person skilled in the art, UV light has a shorter wavelength than visible light and are invisible to the human eye. Although not illustrated in FIGS. 1A and 1B or described in detail herein, oven 10 may also include other modules and components that assist in the operation of oven 10. For example, oven 10 may include a power module to supply power to the process chamber and other components of oven 10, a front-end module adapted to enable an operator to operate the oven 10, substrate storage module that stores the substrates to be treated in process chamber, vacuum pump(s) to pump air and other gases into and out of the process chamber, gas flow devices (e.g., valves, pumps, blowers, pumps, etc.) to control the flow of gases into and out of the process chamber, analyzers (e.g., oxygen analyzer) to monitor the concentration of oxygen and/or other gases in the process chamber, etc.

Figure 2A:
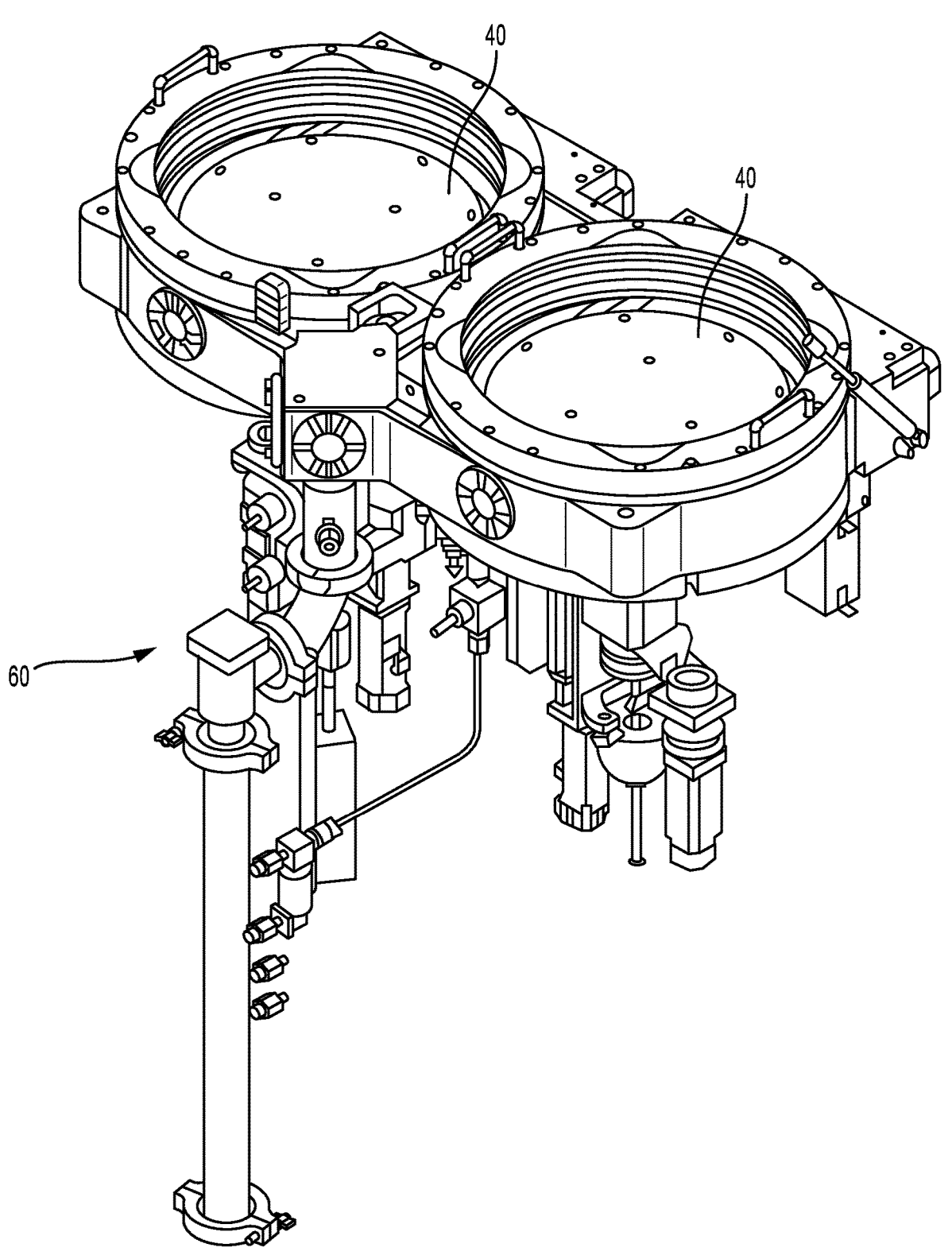
FIGS. 2A and 2B illustrate external views of exemplary process chambers of the process module of FIG. 1B.
Figure 2B:
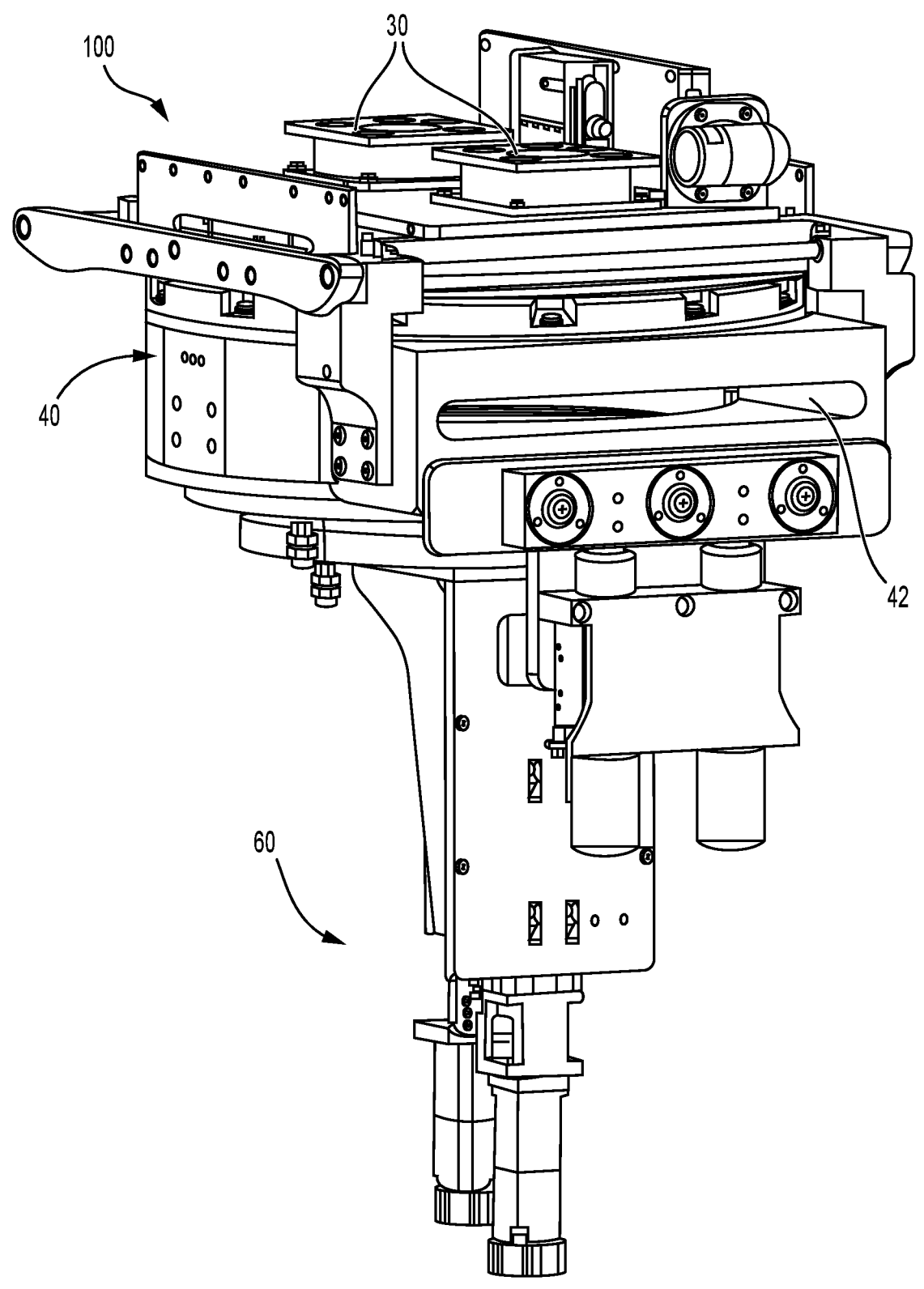

With reference to FIG. 1B, each process module 20 may include one or more process chambers within housing 26. FIGS. 2A and 2B illustrate an external view of two exemplary process chambers 40 of process module 20. It should be noted that some components of the process module 20 (e.g., housing 26, UV module 30, etc.) have been removed in FIG. 2A to show features hidden by the components. Although a process module 20 with two process chambers 40 is described, this is only exemplary. In some embodiments, process module 20 may include a different number (e.g., one, three, four, etc.) of process chambers 40. Each process chamber 40 may be configured to receive a substrate (e.g., wafer, panel, semiconductor packages, printed circuit board (PCB), etc.) and may be adapted to subject the substrate to a high temperature process. In the discussion below, a semiconductor wafer with a polymer coating (e.g., dielectric coating, photoresist coating, etc.) will be described as the substate received in process chamber 40. And a polymer curing process will be described as the exemplary process that the substrate is subjected to in process chamber 40. It should be noted that this is only exemplary and any type of substrate may be subject to any high temperature process in process chamber 40.

Figure 3:
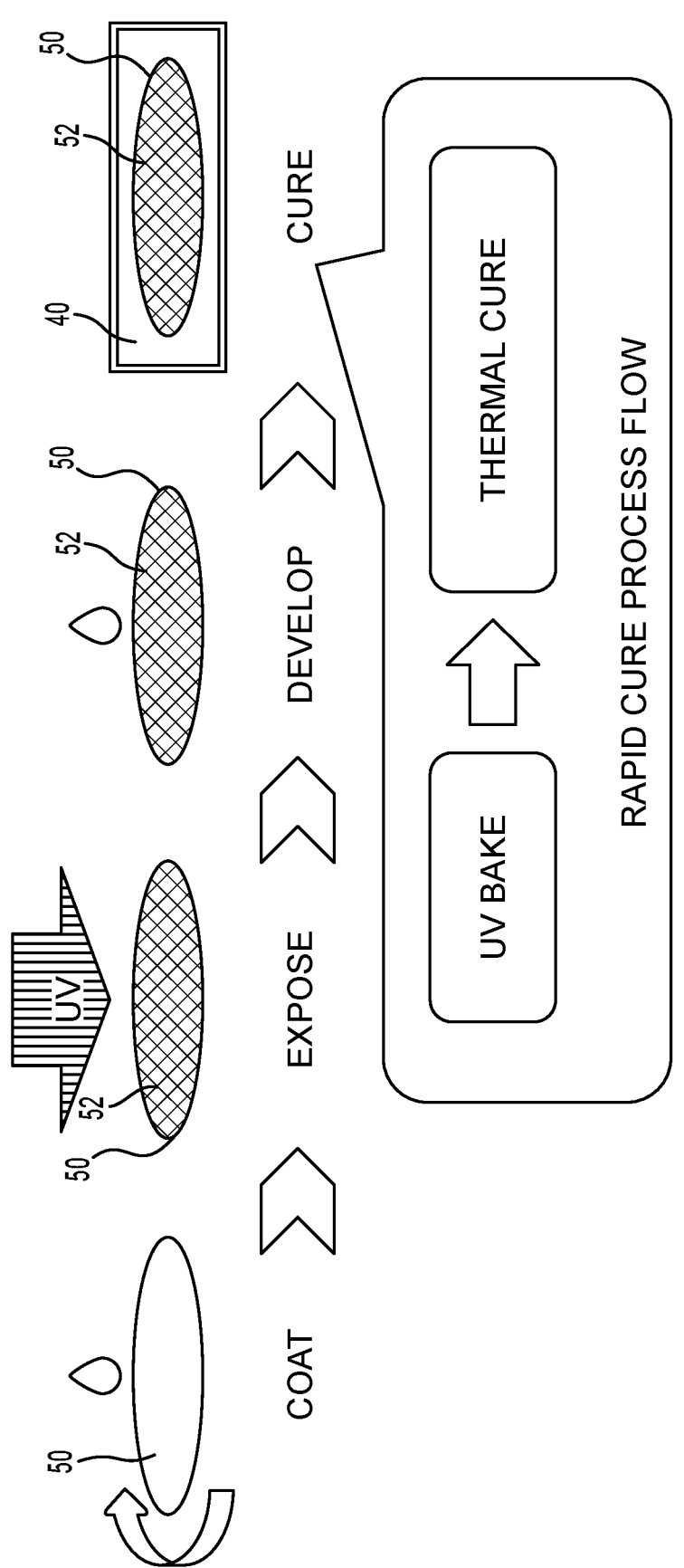
FIG. 3 is a schematic illustration of processing of a substrate in an exemplary embodiment of the current disclosure.

FIG. 3 is a schematic illustration of some exemplary steps in the processing of substrate 50 in an exemplary embodiment of the current disclosure. As schematically illustrated in FIG. 3, before substrate 50 is placed in process chamber 40, the substrate 50 may be coated with a polymer (e.g., a photoresist) to form a coating 52. In some embodiments, the general sequence of processing steps of substrate 50 may include substrate preparation, photoresist spin coat, prebake, exposure, and curing (including UV bake and thermal cure). Substrate preparation may improve the adhesion of the photoresist material to substrate 50 and may include processes to remove contamination from the substrate surface and subsequent baking to remove water/liquids from the surface. A thin, uniform coating 52 of the photoresist may then be applied to the cleaned surface of the substrate 50 by, for example, spin coating. In some embodiments, a liquid photoresist material is poured onto substrate 50, which is then spun on a turntable at a high speed producing the coating at the desired thickness. At the end of this step a solvent-rich coating 52 of photoresist may cover the top surface of substrate 50.

The coated substrate may then be pre-baked to dry the applied photoresist coating 52, and then aligned with a mask and exposed to UV light. The basic principle of a photoresist is its change in solubility when exposure to UV light. In the case of a positive photoresist, the photoactive compound in the photoresist, which is not soluble in an aqueous base developer, will be converted to a soluble product on exposure to UV light (e.g., in the range of 350-450 nm). During this process, the mask pattern will be projected on the coated wafer. When a positive photoresist is used, the portion of the photoresist that is exposed to UV light becomes soluble. When a negative photoresist is used, the portion of the photoresist that is not exposed to UV light becomes soluble. After being exposed to UV light, the coated wafer is developed using a developer solution (by immersion, spraying, etc.). During this process, the soluble portion of the photoresist coating on the substrate 50 dissolves to expose the underlying material.

The substrate 50 with the patterned photoresist coating 52 is then placed in the process chamber 40 of oven 10 to cure and harden the patterned photoresist material so that it will withstand the relatively harsh conditions that it may be exposed to during subsequent processing of the substrate 50. While in process chamber 40, UV light emanating from the UV source(s) of UV module 30 (see FIGS. 1A, 1B) shines on the coating 52 to cause crosslinking of the polymer resin on the surface of the coating 52 to create a stiff skin on the photoresist (e.g., UB bake). In some embodiments, the substrate may also be heated (or exposed to a high temperature) in the process chamber 40 to cure and harden the body of the photoresist coating 52 (e.g., thermal cure). In some embodiments, the substrate 50 may be simultaneously exposed to UV light and high temperature in process chamber 40, while in other embodiments the substrate 50 may be exposed to UV light and high temperature sequentially (e.g., one after the other) in process chamber 40. In such embodiments, the substrate 50 may be exposed to high temperature before or after being exposed to UV light. Exposing the polymer coated substrate to both UV light and high temperature in process chamber 40 allows rapid curing of the polymer coating 52 on the substrate 50.

Figure 4A:
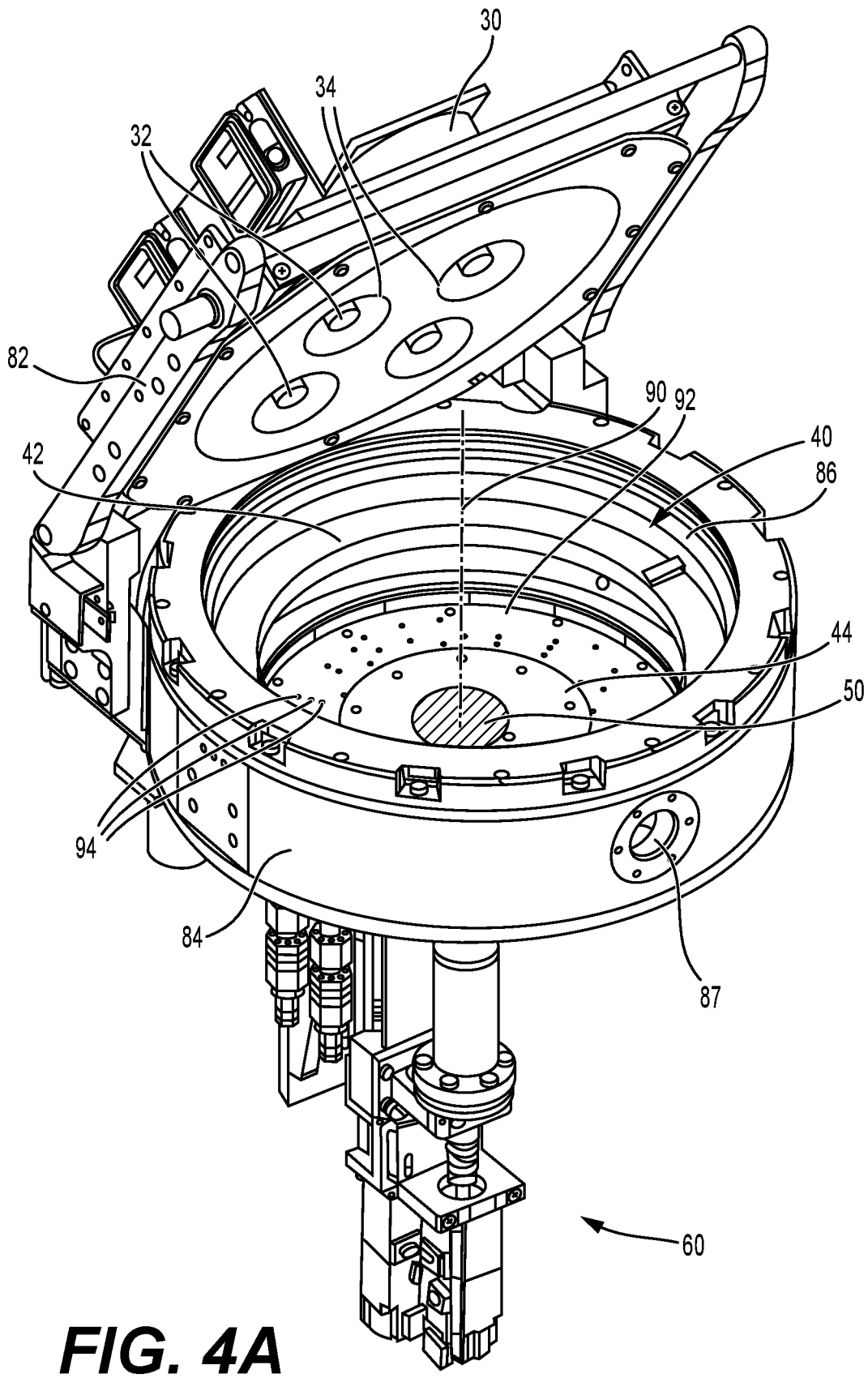
FIGS. 4A-4C illustrate different views of an exemplary process chamber of the apparatus of FIG. 1A.
Figure 4B:
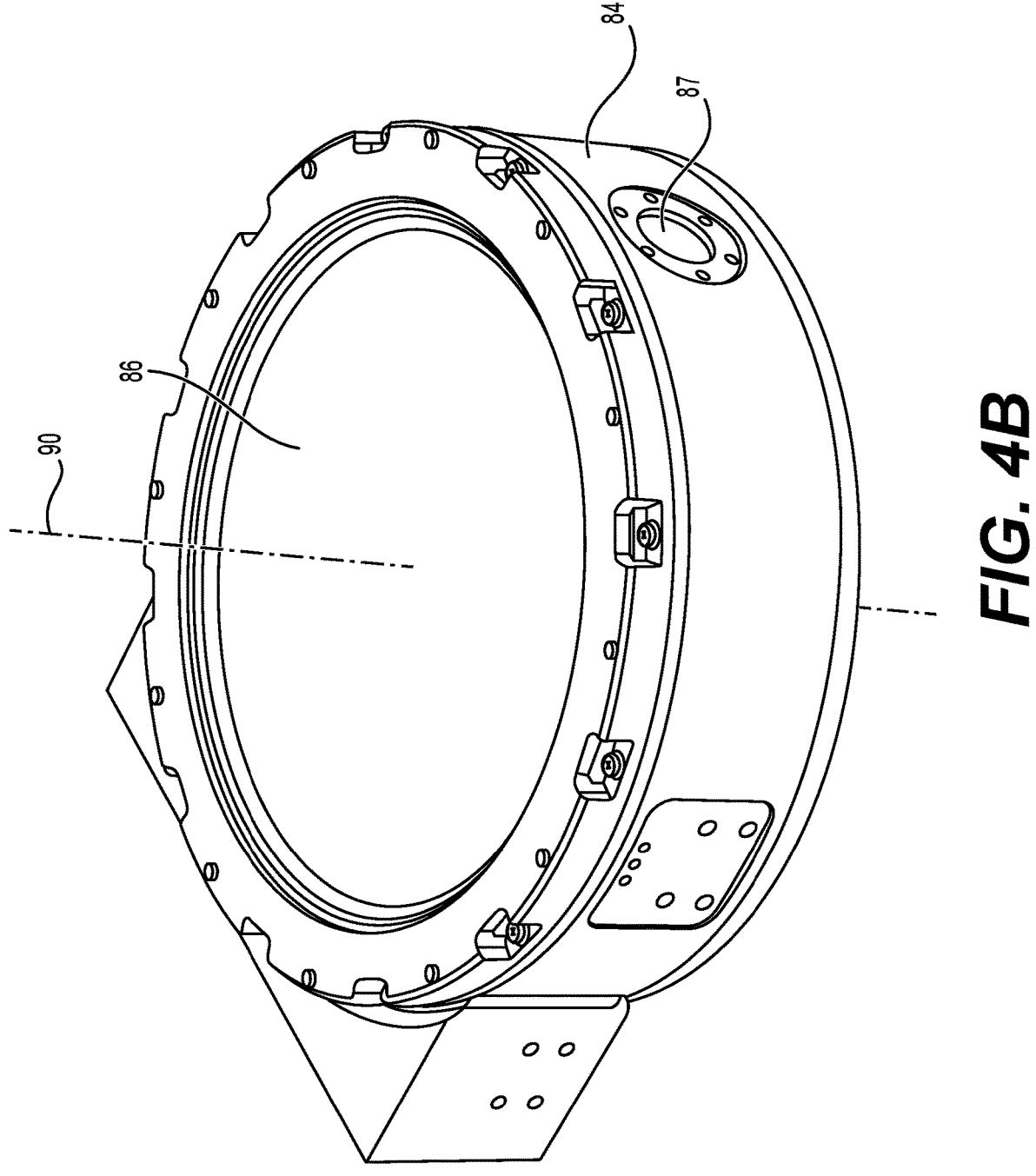
Figure 4C:
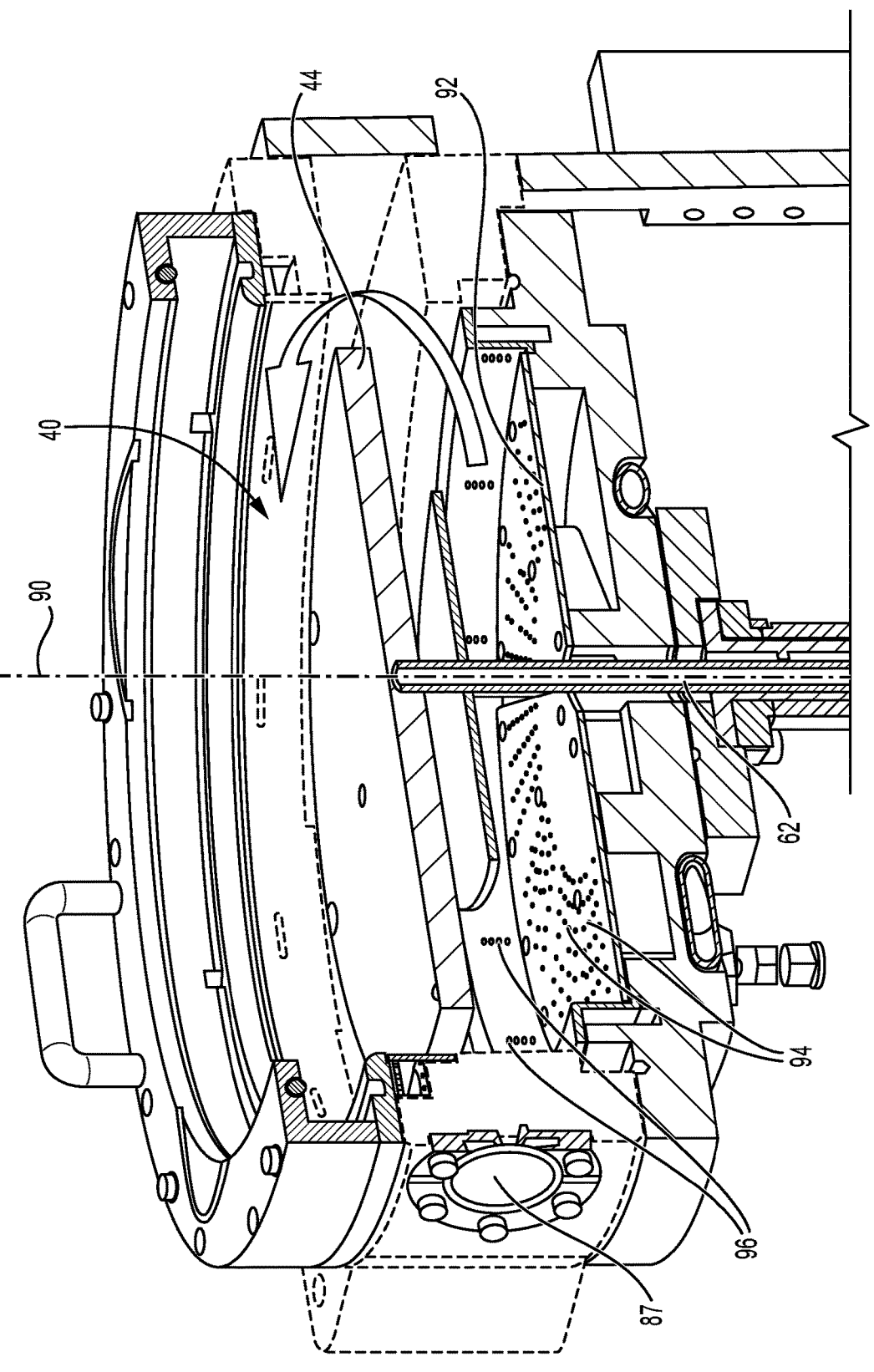

In general, any size of substrate 50 (e.g., 200 mm/300 mm wafer, etc.) may be received in process chamber 40. FIGS. 4A-4C illustrate an exemplary process chamber 40 of oven 10. FIG. 4A illustrates an perspective external view of process chamber 40 with a lid 82 open, FIG. 4B illustrates a perspective view of the process chamber 40 with the lid 82 and other components removed, and FIG. 4C illustrates a cut-away sectional view of process chamber 40. In the discussion below reference will be made to FIGS. 4A-4C. In some embodiments, oven 10 may have a base 84 with an opening or a windows at the top of the base 84. The opening at the top of process chamber 40 may be covered with a window 86 transparent to UV light (e.g., made of quartz, etc.). Base 84 and window 86 together enclose a space that forms process chamber 40. In some embodiments, lid 82 may be configured to engage with the base 84 such that the underside of the lid 82 rests atop window 86. Although not a requirement, in some embodiments, as illustrated in FIG. 4A, lid 82 may be hinged to base 84.

As illustrated in these figures, in some embodiments, process chamber 40 may have a substantially cylindrical shape. However, a substantially cylindrical shape is not a requirement. In general, process chamber 40 may have any shape. In some embodiments, chamber 40 may be substantially square, substantially rectangular, or have another shape. The size of process chamber 40 depends on the application, for example, the size of substrate 50 that will be processed in process chamber 40. For example, a process chamber configured to process 300 mm wafers may, for example, have a diameter of about 450 mm and a height of about 150 mm. A robotic manipulator or arm (not shown) of oven 10 may insert substrate 50 into process chamber 40 through an inlet port 42 (see FIGS. 4A, 2B) defined on base 84. In some embodiments, a valve or a flap may seal the opening of inlet port 42 into process chamber 40 such that process chamber 40 can be pumped down to a low pressure. Base 84 may also include one or more gas ports 87. In some embodiments, process gas may be directed into process chamber 40 through gas port 87. In some embodiments, vacuum pump may be coupled to gas port 87 (and/or to other ports) to generate a vacuum in process chamber 40.

Figure 5A:
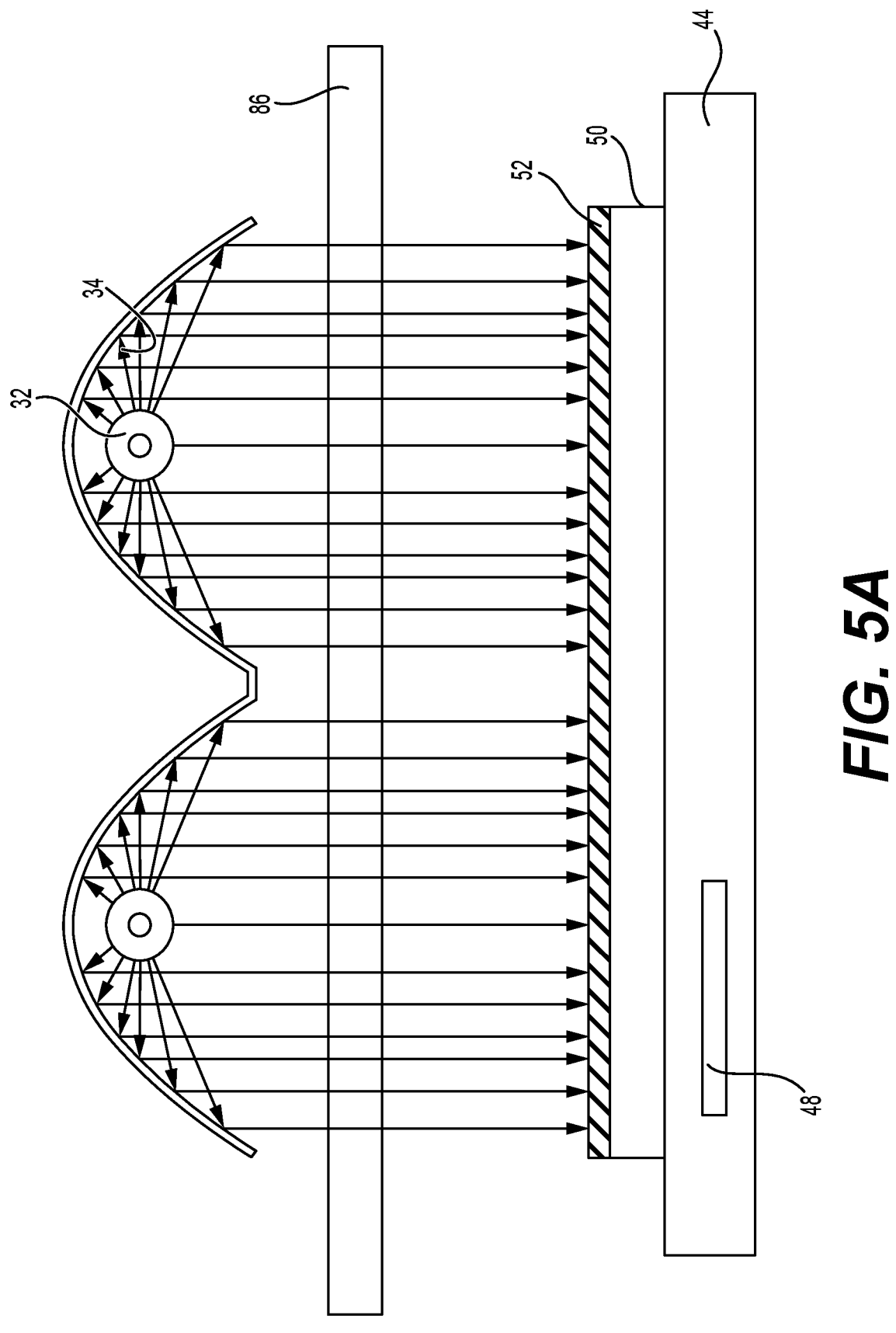
FIGS. 5A and 5B are schematic illustrations of an exemplary UV lamp assembly that may be used with the process chamber in the apparatus of FIG. 1A.
Figure 5B:
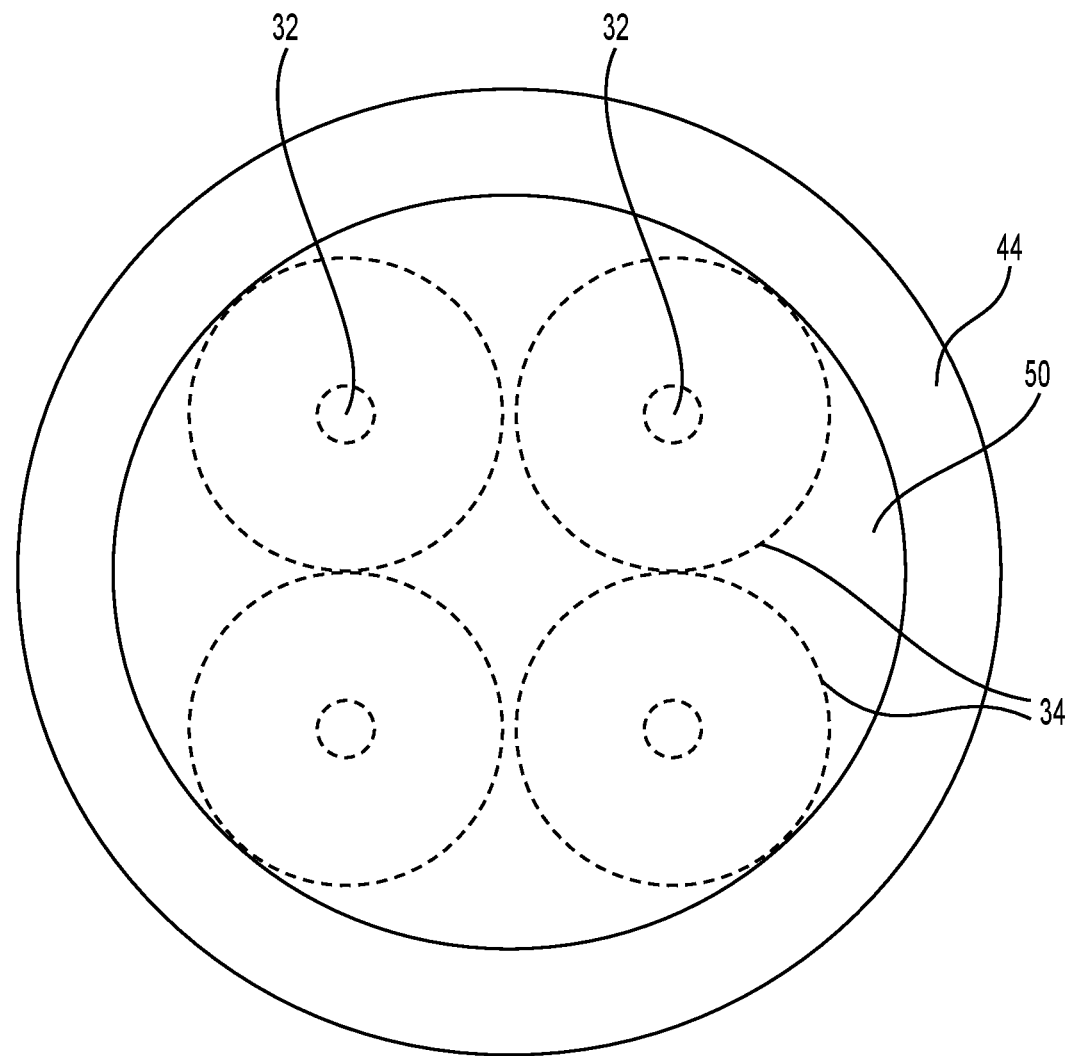

Substrate 50 may be disposed on a rotatable substrate holder 44 in process chamber 40. FIG. 5A is a schematic side view representation and FIG. 5B is a schematic top view representation of a substrate 50 (with coating 52) resting on substrate holder 44 of process chamber 40. In some embodiments, substrate holder 44 may be disk-shaped and may include features adapted to retain the substrate 50 when substrate holder 44 when it spins. These substrate retaining features may take any form (e.g., clips, pins, etc.). In some embodiments, in addition to or in place of a disc-shaped component, substrate holder 44 may have a structure similar to the substrate holder described in U.S. Pat. No. 11,296,049 B1 (which is incorporated by reference in its entirety herein), with a plurality of arms (e.g., 3 arms, 4 arms, etc.) extending radially outward from a central axis 90 of process chamber 40. Substrate holder 44 may include one or more heaters 48 configured to heat substrate 50 supported thereon. Any type of heater 48 may be used. In some embodiments, one or more resistance heaters 48 may be incorporated in (e.g., embedded in) substrate holder 44 to heat the substrate 50 resting on substrate holder 44. In some embodiments, the heaters 48 may be configured to heat the substrate 50 at ramp rate of less than or equal to about 9° C./sec. In some embodiments, substrate holder 44 may also include one or more thermocouples (or other temperature measuring devices) to measure temperature of substrate 50.

With reference to FIG. 4A, oven 10 also includes a motor assembly 60, configured to support and control the movement of substrate 50 in process chamber 40. Motor assembly 60 may include one or more motors coupled to substrate support 44 by a spindle 62 (see FIG. 4C) and configured to rotate (or spin) substrate support 44 (and substrate 50 supported thereon) about central axis 90. Substrate support 44 may be rotated at any speed. In some embodiments, the rotational speed of substrate support 44 may vary between about 0 to 20 RPM. Motor assembly 60 may also include a motor to raise and lower the rotating substrate support 44 along axis 90 between multiple vertically spaced-apart regions or zones within process chamber 40.

Each UV module 30 may include one or more UV sources (or UV lamps 32) configured to irradiate the top surface of substrate 50 resting on substrate support 44 with UV radiation (see FIG. 5A). In some embodiments, each UV lamp 32 may be configured emit radiation in the range of about 260-420 nanometers (nm) with a peak wavelength of about 365 nm. In some embodiments, UV lamps 32 of each process chamber 40 may be configured to collectively irradiate substrate 50 with UV irradiance greater than or equal to about 240 mW/cm2. In some embodiments, as illustrated in FIGS. 4A, 5A, and 5B, each process chamber 40 may include multiple UV lamps 32 arranged to uniformly irradiate the substrate surface. For example, in some embodiments, four UV lamps 32 may be arranged to provide uniform radiation to all areas of substrate 50 supported on substrate support 44. However, four lamps 32 is not a requirement and other embodiments may have a different number (e.g., 1, 2, 3, 4, 5, 6, 7, 8, etc.) of UV lamps 32. For example, FIG. 6A illustrates an exemplary embodiment with one UV lamp 32.

Figure 6A:
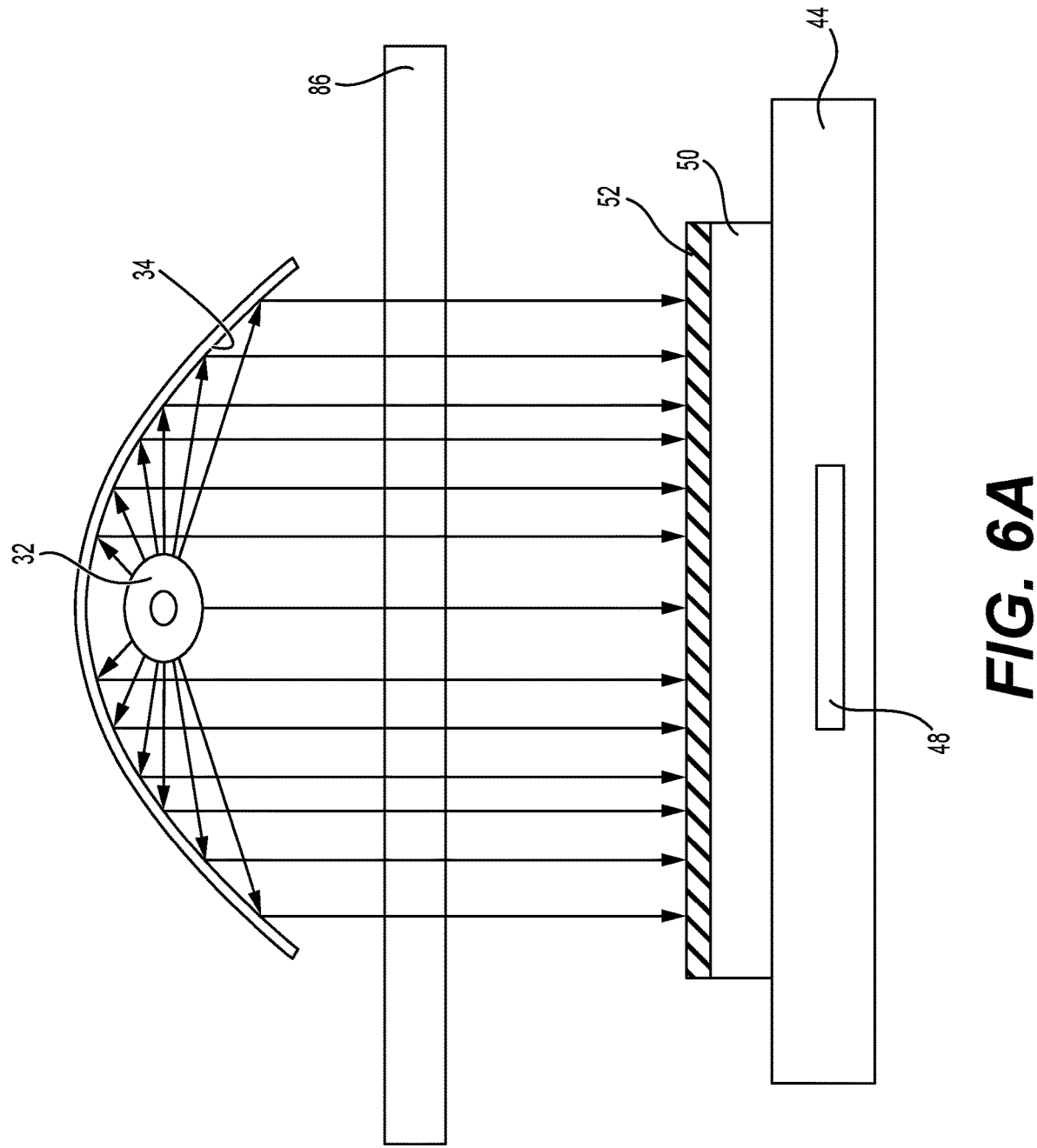
FIGS. 6A-6D are schematic illustrations of exemplary UV lamps in the apparatus of FIG. 1A.

As best seen in FIGS. 5A, and 6A, a focusing reflector 34 may be positioned around each UV lamp 32 to reflect UV radiation towards substrate 50 and provide good UV uniformity over all areas of the coating 52 on the top surface of substrate 50. Reflector 34 may be or include a recessed surface configured to receive or support a UV lamp 32 in its recess. The recessed surface of a reflector 34 may be a polished surface adapted to reflect the UV rays toward substrate 50. Reflector 34 may be made of any suitable material (e.g., aluminum, Dichroic Borosilicate Glass Reflectors, etc.). The polished surface of reflector 34 facing the UV lamp 32 may be curved (e.g., spherical curvature in 3D). In general, the curvature of reflector 34 may be selected such that the UV rays that reflect from reflector 34 irradiate the surface of substrate 50 uniformly. In some embodiments, reflector 34 may have a conical shape. In some embodiments, reflector 34 may have a concave shape, an elliptical shape, or a parabolic shape. When reflector 34 is parabolic, it concentrates the photons from a UV lamp 32 placed in the focus of the parabola. However, other curved shapes are also contemplated. For example, in some embodiments, the curvature of reflector 34 may fit a polynomial function or piecewise polynomial function whose coefficients are chosen so that the irradiance is uniform on substrate 50. The value of the polynomial coefficients depends on the distance of the lamps 32 from the substrate 50, the number of lamps 32, the distance between the lamps 32, etc.

Figure 6B:
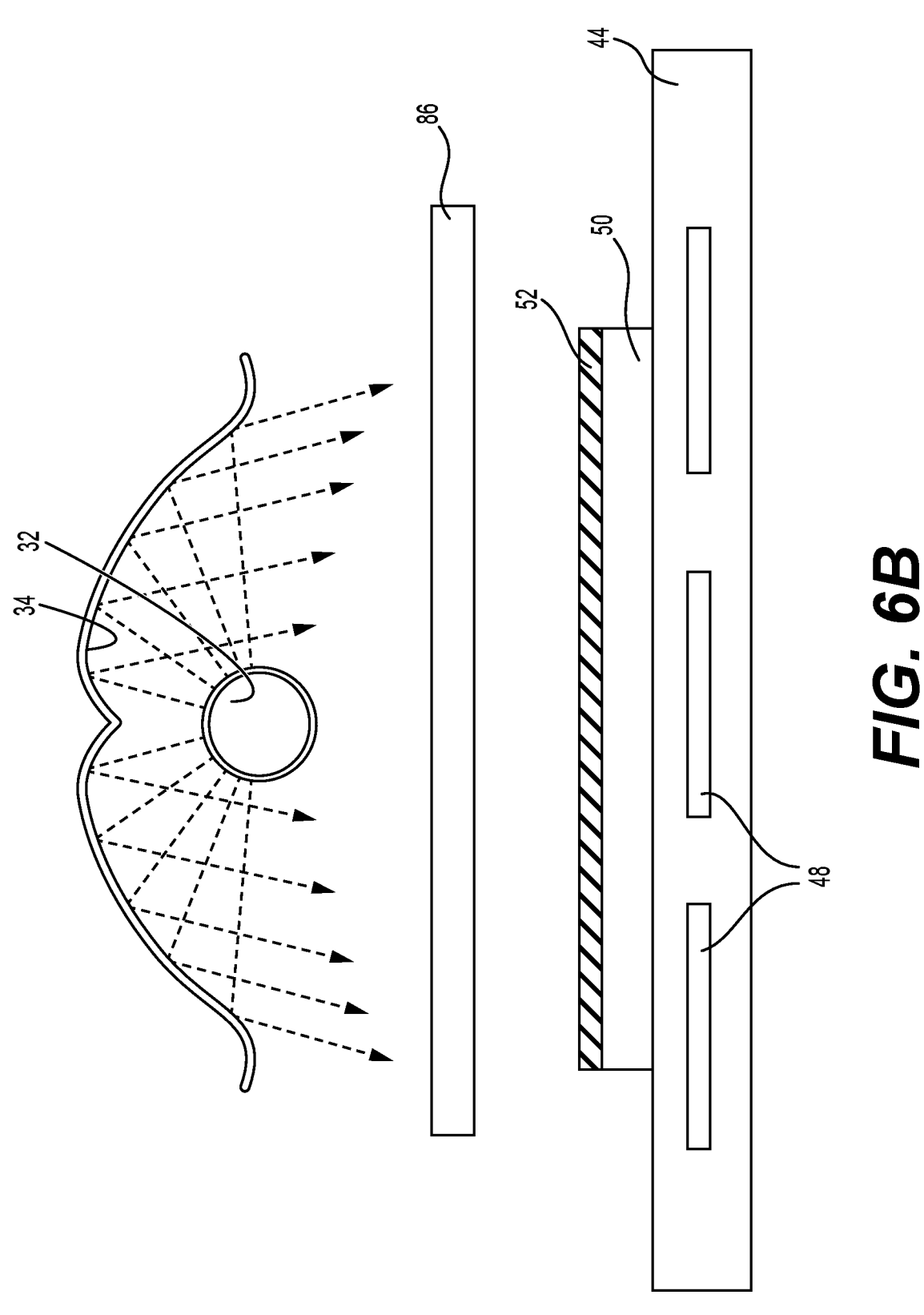

In some embodiments, reflector 34 may have an involute shape. As would be recognized by a person skilled in the art, an involute (or circle involute) is a geometric curve that can be described by the trace of unwrapping a taut string which is tangent to a circle, known as the base circle. For example, if a string is attached to a point on the base circle and the string is extended so that it is tangent to the base circle at the point of attachment. Now, if the string is wound while keeping it taut, the locus of points traced out by the end of the string forms an involute shape. In some embodiments, as illustrated in FIG. 6B, reflector 34 may have a double-involute shape. A double-involute shape is formed by superimposing two involute shapes. For example, if UV lamp 32 of FIG. 6B is considered to be the base circle, one involute curve can be created (as described previously) in one direction and a second involute curve of the same size can be created in the other direction. The double-involute shape may be formed by superimposing the two involute shapes. A double-involute shaped reflector 34 may reflect photons around UV lamp 32, thereby decreasing (or virtually eliminating) photon loss due to reabsorption by lamp 32.

In general, the distance of UV lamps 32 from (the coated surface of the) substrate 50 or substrate support 44 will depend on the number of UV lamps 32, distance between the lamps 32, size of substrate 50, etc. Typically, the spacing of UV lamps 32 from the substrate 50 is chosen so that the combined irradiance from lamp 32 is uniform across the substrate 50. In some embodiments, UV lamps 32 may be vertically spaced apart (e.g., distance along axis 90) from substrate support 44 by about 2-10 inches. In some embodiments, UV lamps 32 may be vertically spaced apart from substrate support 44 by about 4-6 inches. Any number (e.g., 1-8) of UV lamps 32 may be provided in each process chamber 40. The spacing between UV lamps 32 typically depends on the number of lamps 32. In general, the spacing between UV lamps 32 is chosen so that the combined irradiance from the lamps is uniform on substrate 50. In embodiments where a single UV lamp 32 is provided, the UV lamp 32 may be centered on process chamber 40 such that the substrate 50 in process chamber 40 is uniformly and evenly irradiated. In embodiments where multiple UV lamps 32 are provided, the UV lamps 32 may be symmetrically positioned about axis 90. In some embodiments with multiple UV lamps 32, UV lamps 32 may be evenly spaced apart. However, this is not a requirement, and in some embodiments, the lamps 32 may not be evenly spaced apart. In some embodiments, the spacing between UV lamps 32 is variable. For example, the UV lamps 32 may be supported on, for example, tracks, slots, etc. that enable the location of the UV lamps 32 to be changed, thereby enabling the spacing between the UV lamps 32 to be varied.

Figure 6C:
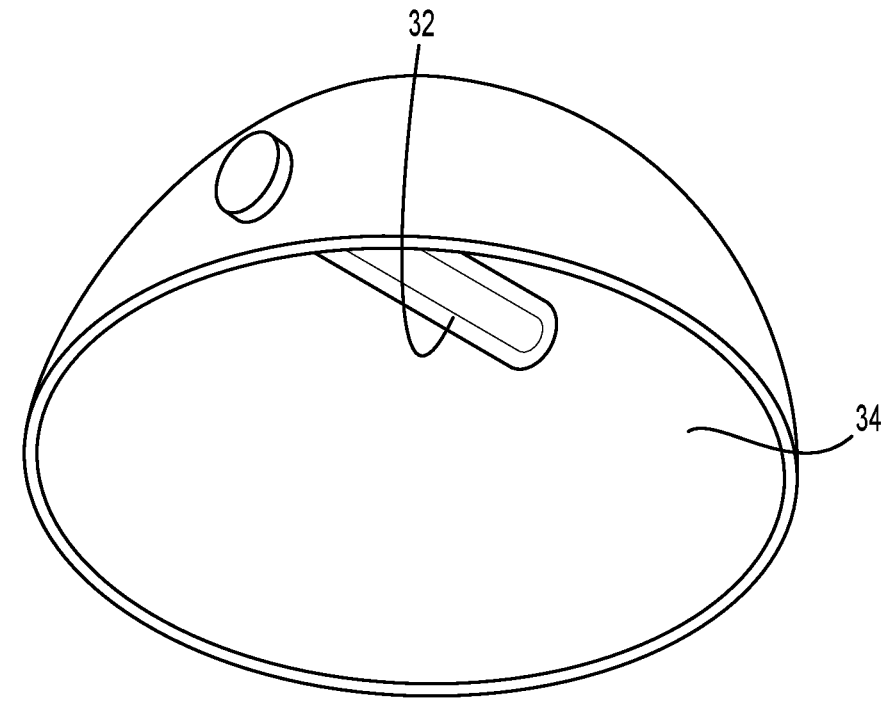
Figure 6D:
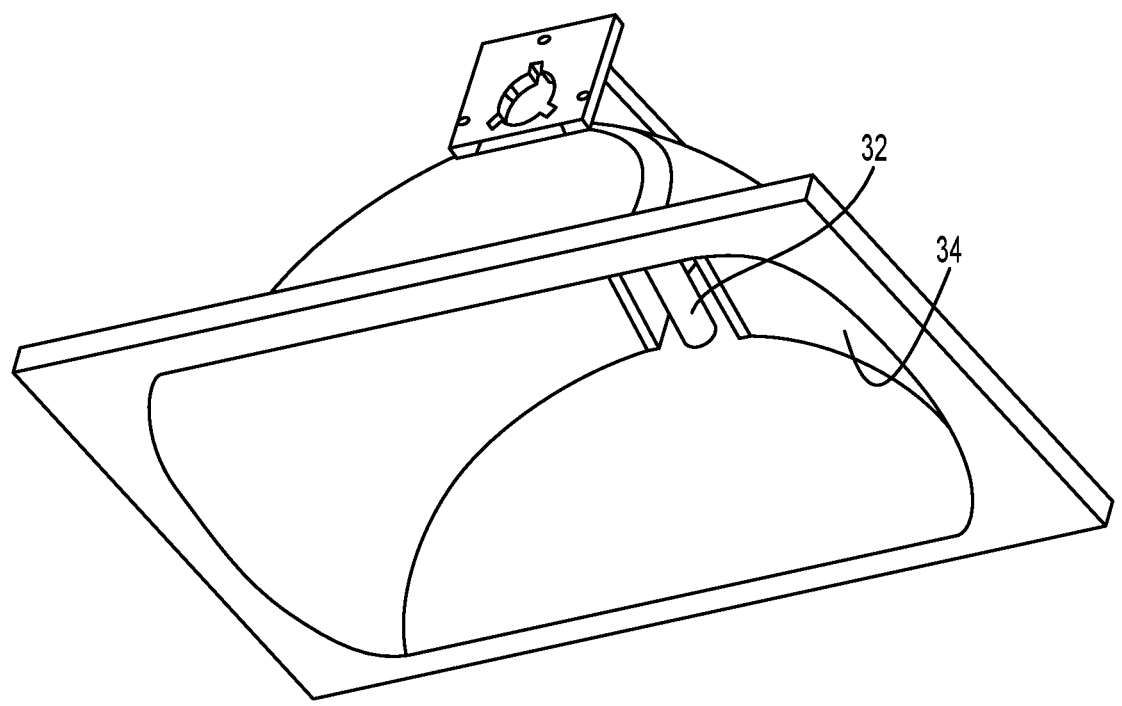

In some embodiments, as illustrated in FIG. 4A, UV lamps 32 of UV module 30 may be disposed on the underside of the hinged lid 82 such that, when lid 82 is closed on the base 84, the UV lamps 32 irradiates the substrate 50 through the transparent window 86 of base 84. However, this is not a requirement. In some embodiments, UV module 30 may be a separate component that is configured to be used with process chamber 40 to irradiate the coated surface of substrate 50 positioned in process chamber 40. Each UV lamp 32 and its associated reflector 34 may have any size and shape. For example, in some embodiments, each UV lamp 32 may have a spherical or a bulb-like (e.g., a tear drop) shape. In some embodiments, UV lamp 32 may have a tube-like shape (e.g., see FIGS. 6C and 6D). It is also contemplated that, in some embodiments, UV lamp 32 may have a serpentine shape (e.g., multiple U-shaped sections connected together) or a spiral shape (e.g., multiple circular sections connected together). For example, in some embodiments, a single serpentine or spiral shaped UV lamp 32 having a size comparable to the size of substrate 50 may be positioned on the underside of lid 82 to evenly irradiate the substrate. The reflector 34 may also have any shape 34. For example, in some embodiments, as illustrated in FIG. 6C, reflector 34 may have substantially circular configuration. In some embodiments, as illustrated in FIG. 6D, reflector 34 may have substantially rectangular configuration.

Figure 7:
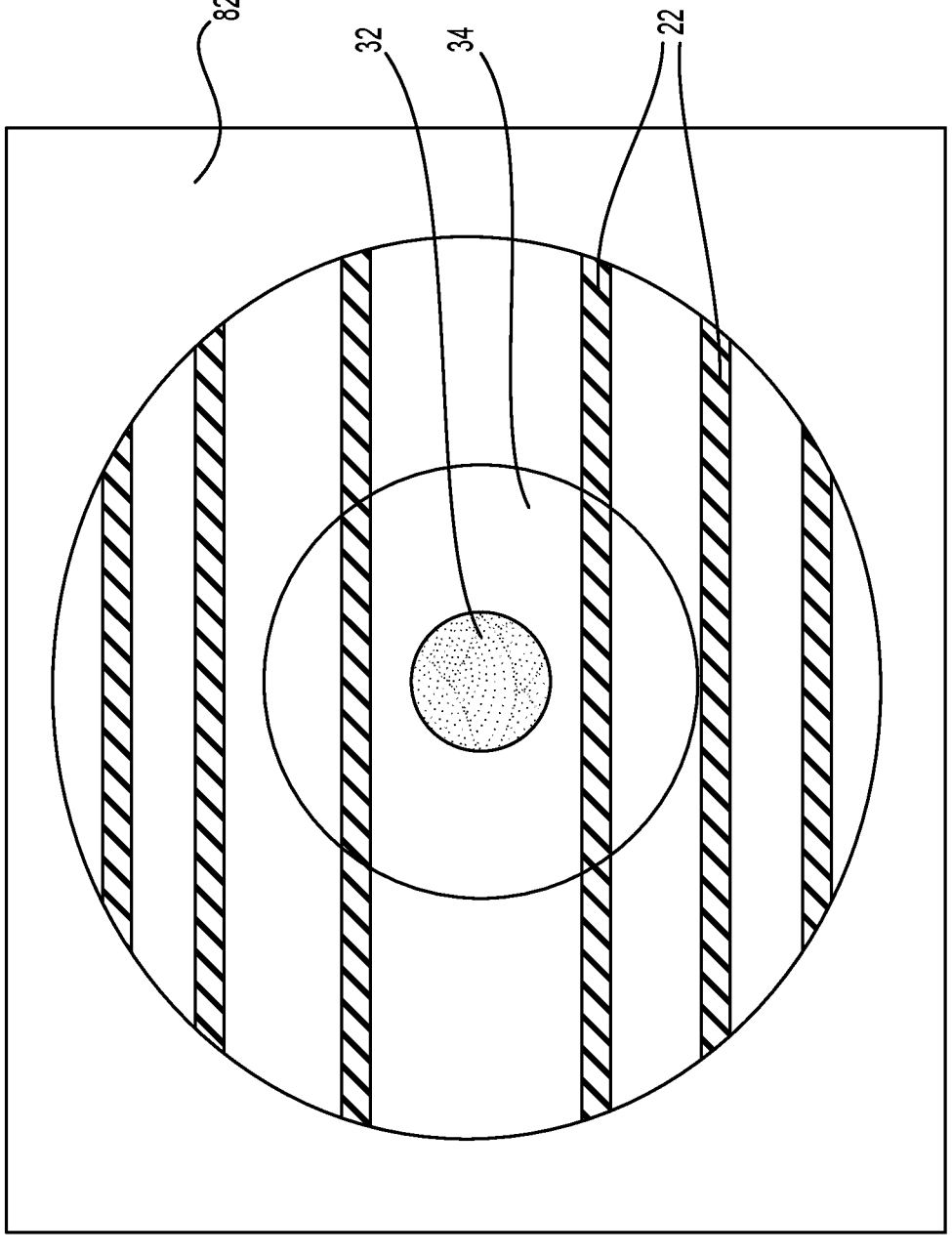
FIG. 7 is a schematic illustration of UV lamps and IR lamps in the apparatus of FIG. 1A.

In some embodiments, as illustrated in FIG. 7, process chamber 40 may also include one or more infrared (IR) lamps 22 in addition to UV lamps 32. In some embodiments, these IR lamps 22 may be positioned on the underside of lid 82 and may be configured to heat substrate 50 through transparent window 86. Any number of IR lamps 22 may be provided with any number of UV lamps 32. And the IR and UV lamps 22, 32 may be arranged in any pattern. It should be noted that although a single UV lamp 32 is illustrated in FIG. 7, this is only exemplary. As explained previously, embodiments of the current disclosure may include multiple UV lamps 32. In some embodiments, the IR lamps 22 may be used to heat substrate 50 in addition to, as an alternative to, heaters 48 (in substrate support 44). In embodiments with both IR and UV lamps 22, 32, the IR lamps 22 may heat the top surface (e.g., coating 52) of substrate 50 and the UV lamps 32 may irradiate the coating 52. In some embodiments, four to ten IR lamps 22 having a power between about 1-5 kW (or about 1.5-3 kW) for each IR lamp 22 may be provided. IR lamps 22 may be controlled by the control system (e.g., of the process apparatus) to heat the substrate 50 to a desired temperature at a desired temperature ramp rate. For example, a different number of IR lamps 22 may be activated to increase or decrease the ramp rate. Alternatively, or additionally, in some embodiments, the power of IR lamps 22 may be varied to vary the temperature ramp rate. In some embodiments, the control system may control the power to the IR lamps 22 based on the detected temperature in the process chamber 40 (e.g., using a feedback loop). The IR lamps 22 may be evenly spaced apart or the spacing between the lamps 22 may be uneven. For example, in some embodiments, as illustrated in FIG. 7, the spacing of the IR lamps 22 at the edges may be smaller than their spacing at the center to accommodate heat loss from the edges of substrate 50. The IR lamps 22 of process chamber 40 are described in more detail in U.S. patent application Ser. No. 17/872,320 and U.S. Pat. Nos. 11,465,225 and 11,296,049 (incorporated by reference herein).

Figure 8:
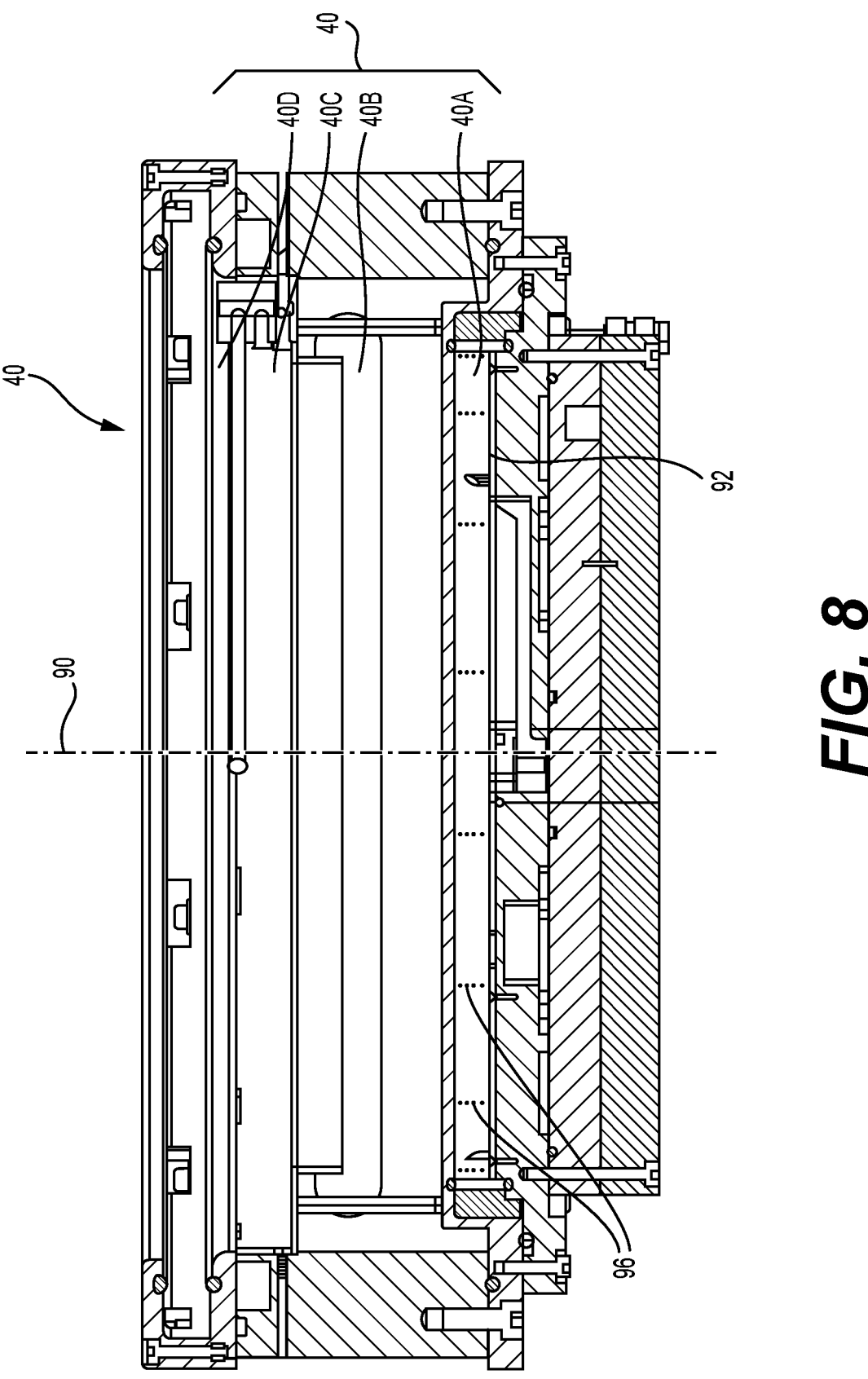
FIG. 8 is a side view of an exemplary process chamber showing its different zones.

FIG. 8 illustrates a side view of process chamber 40. Process chamber 40 may define a plurality of vertically spaced-apart virtual zones. These zones may include cool-down zone 40A at the base of chamber 40, transfer zone 40B directly above cool-down zone 40A, first working zone 40C directly above transfer zone 40B, and second working zone 40D directly above the first working zone 40C and the transparent window 86 at the top of chamber 40. These virtual zones 40A-40D may be adapted for different operating environments (e.g., temperature, atmosphere, etc.) during processing of substrate 50. During processing, substrate support 44 is configured to move (i.e., raise and lower) substrate 50 between the different zones 40A-40D of process chamber 40. A cold plate 92 forms the base of process chamber 40. In some embodiments, while in the cool-down zone 40A, the back side of substrate support 44 may contact the cold plate 92 so that the substrate 50 seated on the top side of substrate support 44 may be cooled by conduction. In some embodiments, cold plate 92 may be liquid cooled. For example, cold plate 92 may include liquid coolant channels (not shown) configured to direct a liquid coolant (water or another liquid coolant) therethrough to remove heat conducted from the substrate 50. Cold plate 92 also includes plurality of openings 94 (see FIG. 4A) that may be configured to direct an inert gas (e.g., nitrogen) into the process chamber 40. In some embodiments, nitrogen may be directed into process chamber 40 via openings 94 in the cold plate 92 to cool the back side of the substrate support 44. A plurality of gas-inlet ports 96 may also be positioned on the side wall of the base 84 in the cool-down zone 40A to direct inert gas (e.g., nitrogen) into process chamber 40. When substrate 50 is positioned in the cool-down zone 40A (e.g., seated on cold plate 92), inert gas (e.g., nitrogen or other suitable inert gas) may be directed into process chamber 40 to flow above substrate 50 and cool the top surface of substrate 50 (with coating 52) by convention. In some embodiments, by combining convective heat transfer (e.g., via gas flow through ports 96) and conductive heat transfer (e.g., via cold plate 92), the substrate 50 may be cooled at a fast rate.

Transfer zone 40B is a region above the cool-down zone 40A aligned with the inlet port 42 (see FIGS. 2B, 4A) through which substrate 50 is inserted into process chamber 40. When substrate 50 is inserted into process chamber 40, it enters the chamber 40 at the transfer zone 40B. When substrate 50 is inserted, substrate support 44 is positioned in transfer zone 40B such that substrate 50 can be positioned on the top surface of substrate support 44. First working zone 40C is a region of process chamber 40 above the transfer zone 40B. When substrate 50 is positioned in this zone 40C, process gases and/or chemical vapors may be directed into process chamber 40 for processing of substrate 50. Substrate 50 may also be heated (using, for example, heaters 48) when substrate 50 is positioned in this zone 40C. The second working zone 40D is a region of process chamber 40 above the first working zone 40C. When substrate support 44 raises substrate 50 to the second working zone 40D, UV lamps 32 may irradiate the coated top surface of the substrate 50 through transparent window 86 at the top of process chamber 40. In some embodiments, IR lamps 22 may also heat the top surface of substrate 50 when substrate 50 is positioned in the second working zone 40D. In some embodiments, the UV lamps 32 may irradiate the top surface and IR lamps 22 may heat the top surface when the substrate 50 is positioned in the first working zone 40C. Rotation of substrate support 44 ensures that all regions on the top surface of substrate 50 are irradiated and/or heated substantially uniformly.

In some embodiments, when substrate 50 is in the first and/or the second working zones 40C, 40D, heaters 48 of substrate support 44 may also heat substrate 50 to any desired temperature. Thermocouples in substrate support 44 (and/or other temperature measurement devices of process chamber 40) may measure the temperature of substrate 50 during the heating. In some embodiments, a control system (of the process apparatus) may control the UV lamps 32, the IR lamps 22, and the heaters 48 to control the processing of substrate 50 (for example, the curing of the coating 52 on substrate 50). It should also be noted that, in some embodiments, the functions of one or more of the described zones of process chamber 40 (e.g., cool-down zone 40A transfer zone 40B, first working zone 40C, and the second working zone 40D) may be combined, thereby reducing the number of zones. The different zones 40A-40D of process chamber 40 enables the chamber to be used for different types of processing of substrate 50. For example, when substrate 50 is positioned in the first working zone 40C, the temperature, chamber pressure, chamber environment (e.g., process gases in process chamber 40) etc. may be adapted to subject the substrate 50 in process chamber 40 to a first process (e.g., a thermal process). And when substrate 50 is in the second working zone 40D, the temperature, chamber pressure, chamber environment, etc. may be adapted to subject the substrate 50 to a second process (e.g., a UV curing process) different from the first process. It should be noted that the specific operating conditions (e.g., temperature, pressure, etc.) of each zone 40A-40D will depend upon the process being applied and that not all zones will be used in all processes.

Figure 9:
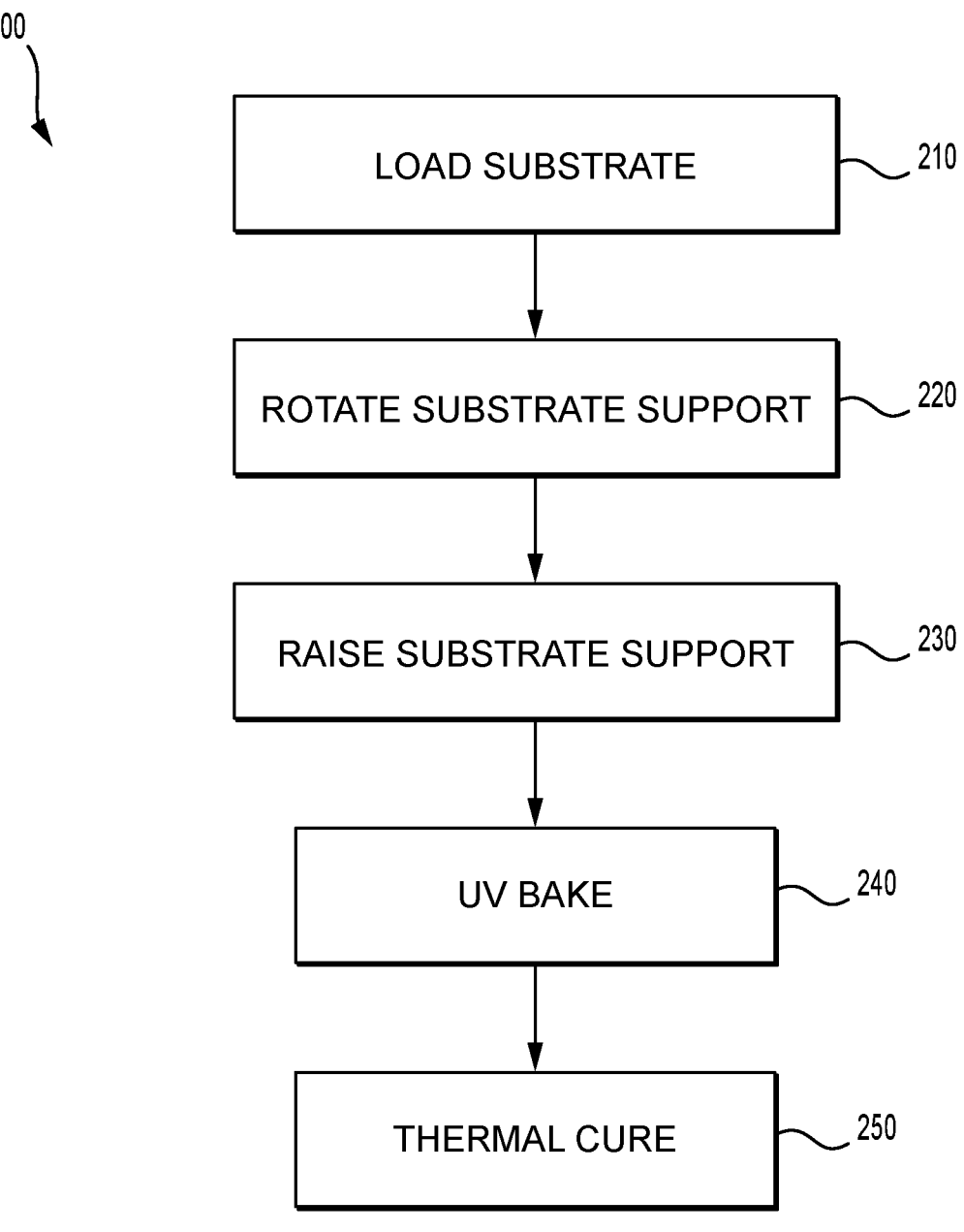
FIG. 9 is a flowchart showing an exemplary method of the current disclosure.

An exemplary method 200 of processing a coated substrate 50 in process chamber 40 will now be described with reference to FIG. 9. A substrate 50 is first loaded into the process chamber 40 through inlet port 42 (step 210). Substrate 50 may be inserted into chamber 40 through port 42 and disposed on the substrate support 44 positioned in transfer zone 40B, for example, using robotic arm. Substrate support 44 may rotate wafer (step 220). In some embodiments, the substrate support 44 may also raise the substrate 50 to one of the first or the second working zones 40C, 40D (step 230). In some embodiments, pressure in the process chamber 40 may also be evacuated to a pressure below atmospheric pressure. In some embodiments, process chamber 40 may be pumped down to a pressure between about 100 milliTorr-100 Torr. In some embodiments, the process chamber may be pumped down to a pressure between about 1-10 Torr. It is also contemplated that, in some embodiments, the pressure in process chamber 40 may be increased. The control system may activate the UV lamps 32 of UV module 30 to irradiate the coating 52 on the top surface of the substrate 50 (step 240) to begin curing the coating 52 (e.g., UV bake of FIG. 3). The heaters 48 of substrate support 44 and/or the IR lamps 22 may be activated to assist in the curing (step 250) (e.g., thermal cure of FIG. 3). In some embodiments, after curing (or other processing) is completed, the substrate 50 may be lowered to the cool-down zone 40A to cool the substrate 50. In some embodiments, inert gas (e.g., nitrogen) may also be directed in through the openings 94 in the cold plate 92 and/or the ports 96 to assist in the cooling. After cooling is complete, substrate support 44 may raise the substrate 50 to transfer zone 40B and substrate 50 may be removed from enclosure through inlet port 42. In some embodiments, a process gas (a chemical) may be directed into the process chamber 40 during the processing of substrate 50. In some embodiments, an inert gas (e.g., nitrogen) may be directed into chamber 40 and/or vacuum pumps (connected to chamber 40) may be activated during or after curing to exhaust residual vapors from process chamber 40.

The above-described method 200 is only exemplary. Many variations are possible. As a person skilled in the art would recognize, the steps of method 200 need not be performed in the order illustrated in FIG. 9. Some steps may be omitted and/or some steps added in other exemplary methods. For example, in some embodiments, UV lamps 32 may be activated (step 240) before loading a substrate into the process chamber (i.e., step 210) or before rotating the substrate support (step 220), before raising the substrate (step 240), etc. As another example, in some embodiments, process chamber 40 may be pumped down to a sub-atmospheric pressure (e.g., between about 1-10 Torr) after loading the substrate into chamber (step 210), etc. As yet another example, in some embodiments, substrate 50 may be heated (step 250) before, or at the same time as, the activation of the UV lamps (step 240). Persons of ordinary skill in the art would recognize and understand these possible variations to be within the scope of the present disclosure. For example, a person or ordinary skill in the art would recognize that any of the processes (or portions thereof) described in U.S. patent application Ser. No. 17/872,320 and/or U.S. Pat. Nos. 11,465,225 and 11,296,049 (which are all incorporated by reference in their entireties herein) may be incorporated with the polymer curing process (or portions thereof) described herein.

A person of ordinary skill in the art would recognize that although the process chamber is disclosed with reference to an oven 10, the disclosed UV and IR lamps and polymer curing process can be carried out in the process chamber of any process apparatus. Furthermore, although the process of curing photoresist on a wafer is described, this is only exemplary. In general, embodiments of the current disclosure may be applied to cure any polymer on one or multiple electronic devices as part of any type of process. For example, multiple electronic devices (e.g., IC dies) with a polymer (e.g., a curable dielectric) may be loaded on a process chamber and the disclosed UV modules used to cure the polymer in an independent process or as part of another process.

What is claimed is:

1. A semiconductor processing apparatus, comprising:
    a process chamber defining an enclosure;
    a substrate support configured to (a) support a substrate, (b) rotate with the substrate about a central axis of the process chamber, and (c) move vertically along the central axis to position the substrate at multiple locations in the enclosure;
    one or more UV lamps configured to irradiate a top surface of the substrate supported on the substrate support; and
    one or more motors configured to rotate the substrate support about the central axis and move the substrate support vertically along the central axis,
    wherein the process chamber comprises a liquid-cooled cold plate that defines a bottom wall of the enclosure.

2. The apparatus of claim 1, wherein the one or more UV lamps include a plurality of UV lamps symmetrically positioned about the central axis.

3. The apparatus of claim 2, wherein the plurality of UV lamps includes four UV lamps.

4. The apparatus of claim 1, wherein the process chamber further includes a transparent window that defines a top wall of the enclosure, wherein the one or more UV lamps are configured to irradiate the top surface of the substrate through the transparent window.

5. The apparatus of claim 1, wherein the process chamber further comprises a lid hinged to a base of the process chamber, and the one or more UV lamps are disposed on an underside of the lid.

6. The apparatus of claim 1, wherein the substrate support further includes one or more heaters configured to heat the substrate supported on the substrate support.

7. The apparatus of claim 1, wherein a side wall of the process chamber further comprises a substrate-inlet port, the substrate-inlet port being configured to direct the substrate into the enclosure.

8. The apparatus of claim 1, wherein the bottom wall of the process chamber includes a plurality of openings configured to direct an inert gas into the enclosure.

9. The apparatus of claim 1, wherein a side wall of the process chamber includes a plurality of gas-inlet ports configured to direct an inert gas into the enclosure.

10. The apparatus of claim 1, wherein the apparatus further includes a plurality of IR lamps configured to heat the top surface of the substrate supported on the substrate support.

11. A semiconductor processing apparatus, comprising:
a process chamber defining an enclosure;
a substrate support positioned in the enclosure and con-figured to (a) support a substrate thereon, (b) rotate along with the substrate about a central axis of the process chamber, and (c) move vertically along the central axis to position the substrate at multiple loca-tions in the enclosure;
a liquid-cooled cold plate that defines a bottom wall of the enclosure;
a transparent window that defines a top wall of the enclosure; and
one or more UV lamps, wherein the one or more UV lamps are configured to irradiate a top surface of the substrate supported on the substrate support through the transparent window.

12. The apparatus of claim 11, wherein the process chamber further comprises a lid hinged to a base of the process chamber, and the one or more UV lamps are disposed on an underside of the lid.

13. The apparatus of claim 11, wherein the substrate support includes one or more heaters configured to heat the substrate supported on the substrate support.

14. The apparatus of claim 11, wherein a side wall of the process chamber further comprises a substrate-inlet port, the substrate-inlet port being configured to direct the substrate into the enclosure.

15. The apparatus of claim 11, wherein the one or more UV lamps includes a plurality of UV lamps symmetrically positioned about the central axis.

16. The apparatus of claim 11, wherein the one or more UV lamps includes only a single UV lamp.

17. The apparatus of claim 11, wherein the liquid-cooled cold plate includes a plurality of openings configured to direct an inert gas into the enclosure.

18. The apparatus of claim 17, wherein a side wall of the process chamber includes a plurality of gas-inlet ports configured to direct the inert gas into the enclosure.

19. The apparatus of claim 11, wherein the apparatus further includes a plurality of IR lamps configured to heat the top surface of the substrate supported on the substrate support.

20. The apparatus of claim 1, wherein the one or more motors are configured to move the substrate support verti-cally along the central axis to a first height to cool the substrate and to a second height to heat the substrate.

21. The apparatus of claim 20, wherein the one or more motors are configured to move the substrate support verti-cally along the central axis to the first height to contact a back side of the substrate support with the liquid-cooled cold plate to cool the substrate.

22. The apparatus of claim 20, wherein the first height is closer to a base of the processing chamber than is the second height.

23. The apparatus of claim 1, further comprising a control system configured to control at least one of the one or more UV lamps or the one or more motors.

* * * * *